(12) United States Patent
Nakata (10) Patent No.: US 8,461,623 B2
(45) Date of Patent: Jun. 11, 2013

(54) POWER SEMICONDUCTOR MODULE (75) Inventor: Shuhei Nakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 212 days.

(21) Appl. No.: 12/991,699

(22) PCT Filed: Apr. 23, 2009

(86) PCT No.: PCT/JP2009/058066
§ 371 (c)(1),
(2), (4) Date: Nov. 9, 2010

(87) PCT Pub. No.: WO2010/004802
PCT Pub. Date: Jan. 14, 2010

(65) Prior Publication Data
US 2011/0062491 A1    Mar. 17, 2011

(30) Foreign Application Priority Data
Jul. 10, 2008  (JP) .................................. 2008-180136

(51) Int. Cl.
*H01L 29/68* (2006.01)
(52) U.S. Cl.
USPC ............ 257/146; 257/177; 257/678; 257/723
(58) Field of Classification Search
USPC .................................. 257/146, E29.169, 356
See application file for complete search history.

(56) References Cited

U.S. PATENT DOCUMENTS

| | | | |
|---|---|---|---|
| 5,751,058 A | 5/1998 | Matsuki | |
| 6,809,411 B2 * | 10/2004 | Hierholzer | 257/678 |
| 7,190,070 B2 * | 3/2007 | Manz et al. | 257/723 |
| 2002/0047132 A1 | 4/2002 | Fukada et al. | |
| 2004/0183188 A1 | 9/2004 | Oohama | |
| 2007/0051974 A1 * | 3/2007 | Azuma et al. | 257/177 |
| 2007/0262387 A1 | 11/2007 | Nonaka et al. | |
| 2009/0057853 A1 * | 3/2009 | Gerbsch et al. | 257/675 |

FOREIGN PATENT DOCUMENTS

| | | |
|---|---|---|
| CN | 1921105 A | 2/2007 |
| DE | 199 27 285 A1 | 12/2000 |
| DE | 103 16 356 A1 | 11/2004 |
| JP | 6 045509 | 2/1994 |

(Continued)

OTHER PUBLICATIONS

International Search Report issued Jul. 21, 2009 in PCT/JP09/058066 filed Apr. 23, 2009.

(Continued)

*Primary Examiner* — Marcos D. Pizarro
*Assistant Examiner* — Suian Tang
(74) *Attorney, Agent, or Firm* — Oblon, Spivak, McClelland, Maier & Neustadt, L.L.P.

(57) ABSTRACT

A power semiconductor module (1) includes a first MOS transistor (16) connected to a positive side power supply terminal via a first conductor pattern (11), a first free wheeling diode (17) connected to the positive side power supply terminal via a second conductor pattern (12), a second MOS transistor (18) connected to a negative side power supply terminal via a third conductor pattern (13), and a second free wheeling diode (19) connected to the negative side power supply terminal via a fourth conductor pattern (14). These semiconductor elements (16-19) are connected to a load side output terminal via a common fifth conductor pattern (15). The semiconductor element (16, 17) connected to the positive side power supply terminal and the semiconductor element (18, 19) connected to the negative side power supply terminal are arranged alternately, substantially linearly.

8 Claims, 8 Drawing Sheets

FOREIGN PATENT DOCUMENTS

| | | |
|---|---|---|
| JP | 9 121019 | 5/1997 |
| JP | 2002 76256 | 3/2002 |
| JP | 2003 068977 | 3/2003 |
| JP | 2004 208411 | 7/2004 |
| JP | 2005 197433 | 7/2005 |
| JP | 2005 216876 | 8/2005 |
| JP | 2007 305962 | 11/2007 |

OTHER PUBLICATIONS

Combined Office Action and Search Report issued Nov. 23, 2012 in Chinese Application No. 200980123625.4 (With English Translation).

Office Action issued Nov. 21, 2012 in German Application No. 11 2009 001 638.3 (With English Translation).

* cited by examiner

POWER SEMICONDUCTOR MODULE

TECHNICAL FIELD

The present invention relates to a power semiconductor module including a semiconductor switching element and diode for electric power.

BACKGROUND ART

A power semiconductor module has a problem in suppressing a surge voltage that is generated when a semiconductor switching element is switched. Therefore, it is necessary to reduce the wiring inductance.

For example, Japanese Patent Laying-Open No. 2005-216876 (Patent Document 1) relates to a power semiconductor module configuring upper and lower arms of one phase by connecting in series two of a group of elements for one arm, each group formed of an IGBT (Insulated Gate Bipolar Transistor) chip and a diode chip connected antiparallel to the IGBT. The input/output terminal of the IGBT is connected to positive side DC power supply terminal, a negative side DC power supply terminal, and a load side output terminal via a copper foil pattern insulated from each other on an insulative substrate. The wire corresponding to the input/output current path of the upper arm side IGBT chip is arranged in proximity to the wire corresponding to the input/output current path of the lower arm side diode chip. Accordingly, the mutual inductance is increased, resulting in reduction in the wiring inductance.

According to Japanese Patent Laying-Open No. 2005-197433 (Patent Document 2), the positive side DC output conductor and the negative side DC output conductor are arranged at substantially the middle of the longer side direction on a rectangular insulation substrate. Further, a semiconductor element chip such as an IGBT and a diode chip are arranged at both sides so as to sandwich the conductors. Accordingly, the mutual inductance caused by the current flowing when the semiconductor element is switched is increased to reduce the total inductance value.

PRIOR ART DOCUMENTS

Patent Documents

Patent Document 1: Japanese Patent Laying-Open No. 2005-216876

Patent Document 2: Japanese Patent Laying-Open No. 2005-197433

SUMMARY OF THE INVENTION

Problems To Be Solved By the Invention

Since the surge voltage at the time of switching becomes higher as the wiring inductance increases, a semiconductor element of high withstand voltage is required. The area of the semiconductor element is increased in proportion to the withstand voltage, leading to increase in the size and cost of the module. Moreover, EMI (Electromagnetic Magnetic Interference) will be generated externally if the surge voltage is high, which may cause erroneous operation of an external device.

Thus, reducing the wiring inductance is a critical issue. However, the effect of reducing the inductance is not sufficient by the approach disclosed in the aforementioned patent documents. The arrangement of each semiconductor element, wiring pattern, power supply terminal, and the like must be designed further carefully.

An object of the present invention is to provide a power semiconductor module that can reduce wiring inductance.

Means For Solving the Problems

The present invention is directed to a power semiconductor module, including a first insulation substrate, a conductor pattern formed on the first insulation substrate, and a plurality of first semiconductor elements and second semiconductor elements provided on the first insulation substrate. The plurality of first semiconductor elements are electrically connected parallel to each other between a positive side power supply and the conductor pattern. At least one of the plurality of first semiconductor elements is a switching element. The plurality of second semiconductor elements are electrically connected parallel to each other between a negative side power supply and the conductor pattern. At least one of the plurality of second semiconductor elements is a switching element. A plurality of first current paths between the positive side power supply and the conductor pattern running through the plurality of first semiconductor elements respectively, and a plurality of second current paths between the negative side power supply and the conductor pattern running through the plurality of second semiconductor elements respectively are aligned alternately along a periphery of the conductor pattern.

Effects of the Invention

According to the present invention, when the switching element included in the first semiconductor element is switched, a surge current flows through the second semiconductor elements located at both sides. In contrast, when the switching element included in the second semiconductor element is switched, a surge current flows through the first semiconductor elements located at both sides. Namely, a surge current flows clockwise and counterclockwise, i.e. in both directions, when viewed from the thickness direction of the substrate. Accordingly, the magnetic flux by the current will cancel each other to allow reduction in the wiring inductance.

MODES FOR CARRYING OUT THE INVENTION

Embodiments of the present invention will be described in detail hereinafter with reference to the drawings. The same or corresponding elements have the same reference characters allotted, and description thereof will not be repeated.

First Embodiment

Figure 1:
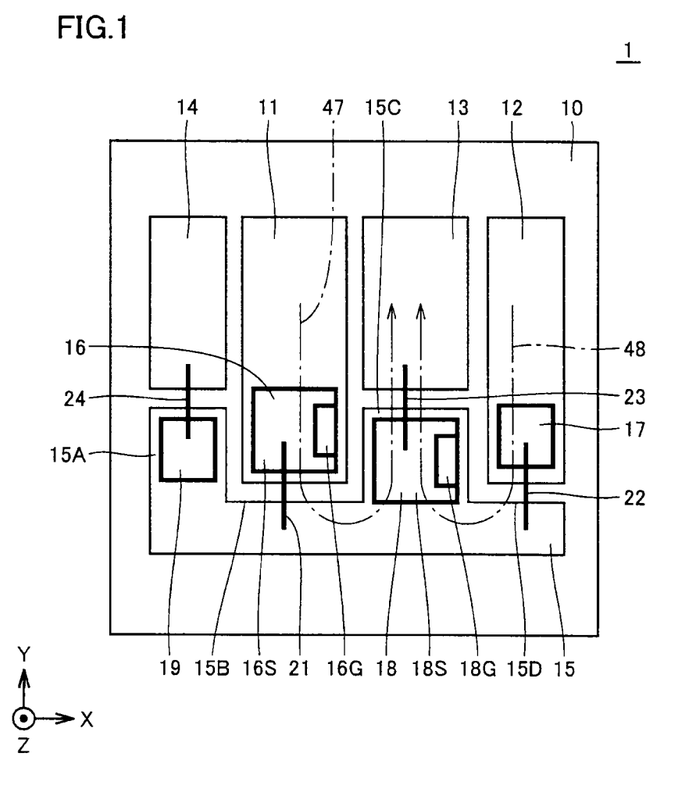
FIG. 1 is a plan view showing a configuration of the main part of a power semiconductor module 1 according to a first embodiment of the present invention.

FIG. 1 is a plan view showing a configuration of the main part of a power semiconductor module 1 according to a first embodiment of the present invention. In FIG. 1, the lateral direction, the vertical direction, and the direction perpendicular to the drawing sheet are taken as the X direction, the Y direction and the Z direction, respectively. The direction from the left side towards the right side in the drawing is the +X direction. The direction from the lower side towards the upper side in the drawing is the +Y direction. The direction from the back side to the top side of the drawing sheet is the +Z direction. An insulation substrate 10 shown in FIG. 1 is arranged along the XY plane. The thickness direction of insulation substrate 10 corresponds to the Z direction. FIG. 1 represents the state prior to coupling a P side power supply terminal 26, an N side power supply terminal 27, and a load side output terminal 28 to insulation substrate 10. The arrangement of these terminals 26-28 will be described afterwards with reference to FIGS. 3-5.

Figure 2:
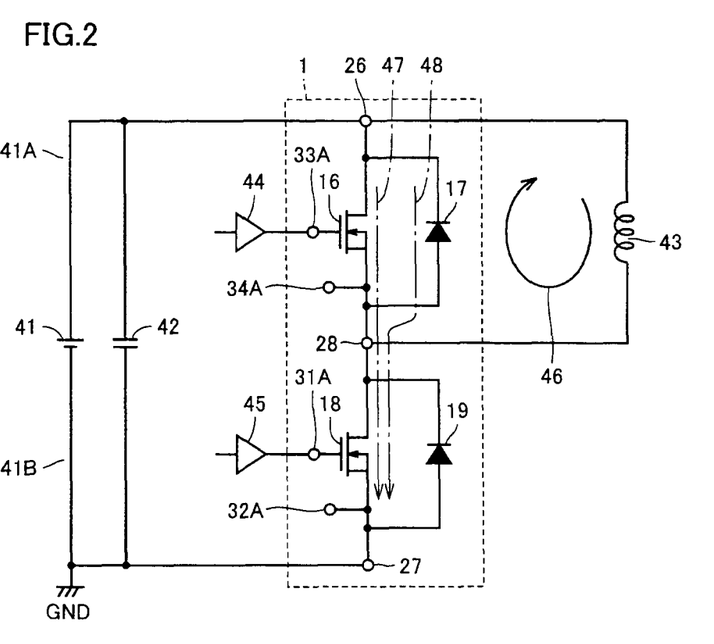
FIG. 2 is a circuit diagram corresponding to power semiconductor module 1 of FIG. 1.

FIG. 2 is a circuit diagram corresponding to power semiconductor module 1 of FIG. 1. FIG. 2 also shows an example of a peripheral circuit connected to power semiconductor module 1.

Referring to FIG. 2, power semiconductor module 1 is an inverter module of the so-called 2in1 structure. Power semiconductor module 1 includes a positive side (P side) power supply terminal 26, a negative side (N side) power supply terminal 27, a load side output terminal 28, N channel MOSFETs (Metal Oxide Semiconductor Field Effect Transistors) 16 and 18 as switching elements, and diodes 17 and 19. The MOSFET is also referred to as "MOS transistor" hereinafter.

MOS transistor 16 is connected between P side power supply terminal 26 and load side output terminal 28. MOS transistor 18 is connected between load side output terminal 28 and N side power supply terminal 27. In the first embodiment, MOS transistors 16 and 18 are formed using silicon carbide (SiC).

Diode 17 is connected parallel to MOS transistor 16. Diode 17 has its cathode connected to P side power supply terminal 26 and its anode connected to load side output terminal 28. In other words, diode 17 is connected in the reversed biased direction. Similarly, diode 19 is connected parallel to MOS transistor 18. Diode 19 has its cathode connected to load side output terminal 28, and its anode connected to N side power supply terminal 27. In other words, diode 19 is connected in the reversed biased direction. Diodes 17 and 19 are free wheeling diodes allowing a current flow when MOS transistors 16 and 18, respectively, are off In the first embodiment, Schottky barrier diodes are employed for diodes 17 and 19.

In accordance with the above-described configuration, MOS transistor 16 and diode 17 connected to P side power supply terminal 26 constitute the upper arm. Semiconductor elements 16 and 17 of the upper arm are also referred to as P side semiconductor elements 16 and 17 hereinafter. Further, MOS transistor 18 and diode 19 connected to N side power supply terminal 27 constitute the lower arm. Semiconductor elements 18 and 19 of the lower arm are also referred to as N side semiconductor elements 18 and 19 hereinafter.

Power semiconductor module 1 of FIG. 2 is connected to a DC power supply 41, a smoothing capacitor 42, drive circuits 44 and 45 for gate driving, and an inductor 43 as an example of a load circuit. DC power supply 41 has a positive side power supply node 41A connected to P side power supply terminal 26, and a negative side power supply node 41B connected to N side power supply terminal 27. In addition, capacitor 42 is connected parallel to DC power supply 41. Drive circuit 44 is connected to a gate terminal 33A for MOS transistor 16 to control the voltage across gate terminal 33A and source terminal 34A. Similarly, drive circuit 45 is connected to a gate terminal 31A for MOS transistor 18 to control the voltage across gate terminal 31A and source terminal 32A.

A specific configuration of power semiconductor module 1 will be described hereinafter with reference to FIG. 1. Power semiconductor module 1 of FIG. 1 includes a ceramic insulation substrate 10 such as of aluminium nitride (AlN), and conductor patterns 11, 12, 13, 14 and 15 formed at the surface of insulation substrate 10 (hereinafter, also referred to as the front face), and isolated from each other. Conductor patterns 11 to 15 are formed using, for example, copper foil. Conductor patterns 11 and 12 have P side power supply terminal 26 solder-connected, whereas conductor patterns 13 and 14 have N side power supply terminal 27 solder-connected, as will be described afterwards with reference to FIGS. 3 and 4. Moreover, conductor pattern 15 has load side output terminal 28 solder-connected. The back side of the substrate (hereinafter, referred to as the rear face) has copper foil (not shown) entirely applied thereover.

As shown in FIG. 1, conductor pattern 15 takes a generally F-shape form, and includes convex pattern portions 15A and 15C protruding in the +Y direction and concave pattern portions 15B and 15D recessed in the −Y direction, all located alternately. Conductor patterns 11 to 14 are formed adjacent to pattern portions 15A to 15D, respectively, of conductor pattern 15 in the +Y direction, and aligned in the order of conductor patterns 14, 11, 13 and 12 from the −X direction towards the +X direction. In other words, conductor patterns 14 and 13 are formed adjacent to convex pattern portions 15A and 15C, respectively. Conductor patterns 11 and 12 are formed adjacent to concave pattern portions 15B and 15D, respectively.

MOS transistors 16 and 18 and diodes 17 and 19 formed as individual semiconductor chips are also mounted on the front face of insulation substrate 10. MOS transistor 16 includes a source electrode 16S and a gate electrode 16G formed at the upper side of the drawing sheet (+Z direction), and a drain electrode formed at the back side of the drawing sheet (−Z direction). Similarly, MOS transistor 18 includes a source electrode 18S and a gate electrode 18G formed at the upper side of the drawing sheet (+Z direction), and a drain electrode formed at the back side of the drawing sheet (−Z direction). Diodes 17 and 19 each include an anode formed at the upper side of the drawing sheet (+Z direction), and a cathode formed at the back side of the drawing sheet (−Z direction).

The drain electrode of MOS transistor 16 is solder-connected on conductor pattern 11. MOS transistor 16 is arranged in proximity to concave pattern portion 15B of conductor pattern 15. Concave pattern portion 15B and source electrode 16S of MOS transistor 16 are connected by a bonding wire 21. Although only one bonding wire 21 is shown in FIG. 1 to simplify the illustration, a plurality of bonding wires 21 to reduce the inductance are actually formed. The same applies to other bonding wires shown in FIG. 1.

The drain electrode of MOS transistor 18 is solder-connected to convex pattern portion 15C of conductor pattern 15, adjacent to conductor pattern 13. MOS transistor 18 has a source electrode 18S connected to conductor pattern 13 through bonding wire 23.

The cathode of diode 17 is solder-connected on conductor pattern 12. Diode 17 is disposed in proximity to concave pattern portion 15D of conductor pattern 15. Concave pattern portion 15D and the anode of diode 17 are connected by a bonding wire 22.

The cathode of diode 19 is solder-connected to convex pattern portion 15A of conductor pattern 15, adjacent to conductor pattern 14. Diode 19 has its anode connected to conductor pattern 14 by bonding wire 24.

In power semiconductor module 1 formed as set forth above, diode 19, MOS transistor 16, MOS transistor 18, and diode 17 are sequentially arranged substantially linearly from the −X direction to the +X direction. In other words, semiconductor elements 18 and 19 of the N side and semiconductor elements 16 and 17 of the P side are arranged alternately, substantially linearly from the −X direction to the +X direction. In addition, P side conductor patterns 11 and 12 connected to P side power supply terminal 26 and N side conductor patterns 13 and 14 connected to N side power supply terminal 27 are arranged alternately in the order of NPNP along the periphery of conductor pattern 15 connected to load side output terminal 28.

Focusing attention on the current path, the current path between the positive side power supply node (41A in FIG. 2) and conductor pattern 15 running through each of P side semiconductor elements 16 and 17, and the current path between the negative side power supply node (41B in FIG. 2) and conductor pattern 15 running through each of N side semiconductor elements 18 and 19 are aligned alternately along the periphery of conductor pattern 15. As a result, the inductance can be reduced, allowing suppression in the surge voltage that occurs at the time of switching of MOS transistors 16 and 17. The reason will be described hereinafter.

Referring to FIG. 2, it is assumed that free-wheeling current 46 flows between inductor 43 identified as a load and diode 17 at the point of time immediately before N side MOS transistor 18 is turned on. At the moment MOS transistor 18 is turned on, the current path changes to a path flowing in sequence from DC power supply 41, load inductor 43, MOS transistor 18, and DC power supply 41. Since the voltage of the drain electrode of N side MOS transistor 18 suddenly changes from a high-voltage state to a low-voltage state, the voltage across P side MOS transistor 16 and diode 17 also changes suddenly. Accordingly, a displacement current 47 caused by the output capacitance of MOS transistor 16 and a displacement current 48 caused by the junction capacitance of diode 17 are generated. Displacement current 47 flows in the order of DC power supply 41, P side MOS transistor 16, N side MOS transistor 18, and DC power supply 41. Displacement current 48 flows in the order of DC power supply 41, P side diode 17, N side MOS transistor 18, and DC power supply 41. In the case where a PIN (Positive-Intrinsic-Negative) diode is employed for diode 17, leakage current due to the hole accumulation effect (recovery current) will further flow to diode 17. Almost no recovery current is generated in the case of the first embodiment employing a Schottky barrier diode 17.

A value corresponding to multiplication of this current time change (di/dt) by the inductance will be observed as the surge voltage. The amount of current variation will become greater as the current value at the time of conduction of MOS transistor 18 becomes larger, and as the switching time of MOS transistor 18 becomes shorter. Therefore, since the amount of current variation will inevitably become larger in accordance with the higher performance of transistors, reducing the inductance becomes particularly significant in order to suppress the surge voltage.

It is to be noted that inductance includes self-inductance and mutual inductance. Self-inductance is ascribed mainly to the bonding wire. It is therefore important to shorten the length of the bonding wire to reduce the self-inductance. Mutual inductance depends greatly on the current path on the circuit pattern. The effective inductance can be reduced greatly by carefully designing the current path.

Specifically, in the case of power semiconductor module 1 of the first embodiment, the paths of displacement currents 47 and 48 are separated in two directions, as shown in FIG. 1. When viewed from the thickness direction of insulation substrate 10 (Z direction), the paths of displacement currents 47 and 48 run in opposite directions, i.e. clockwise and counterclockwise, so that the generated magnetic flux cancel each other. Moreover, the inner side area of the paths of displacement currents 47 and 48 is small since conductor patterns 11 to 15 are arranged on insulation substrate 10 in close proximity to each other. Therefore, the effective inductance is reduced.

The reason why clockwise current and counterclockwise current of opposite directions occur to cancel the magnetic flux is because the current path between P side conductor patterns 11 and 12 and load side conductor pattern 15 running through each of P side semiconductor elements 16 and 17, and the current path between N side conductor patterns 13 and 14 and load side conductor pattern 15 running through each of N side semiconductor elements 18 and 19 are aligned alternately along the X direction (the direction along the periphery of conductor pattern 15). In the case where P side MOS transistor 16 is switched, surge current flows in both directions, i.e. clockwise and counterclockwise, via N side semiconductor elements 18 and 19 located at respective sides. In contrast, when N side MOS transistor 18 is switched, surge current flows in both directions, i.e. clockwise and counterclockwise, via P type semiconductor elements 16 and 17 located at respective sides. It is to be noted that when the MOS transistor located at the ends in the arrangement direction of the semiconductor elements (X direction) is switched, a current will not flow in both directions, i.e. clockwise and counterclockwise. Therefore, it is desirable that diodes 17 and 19 are disposed at the ends in the arrangement direction of the semiconductor elements (X direction).

The computation result of the inductance at the current path of FIG. 1 actually using electromagnetic analysis software FAST-HENRY is 7 nH. The computation result of the inductance in the case where P side semiconductor elements 16 and 17 are located adjacent to each other and N side semiconductor elements 18 and 19 are located adjacent to each other, differing from the case shown in FIG. 1, is approximately 15 to 20 nH. Therefore, it is appreciated that power semiconductor module 1 of the first embodiment can have the inductance reduced approximately ½ as compared to a conventional element arrangement.

Although the above-described example is based on the case where MOS transistor 18 is turned on, a similar effect in reducing the inductance can be expected also in the case of turning off. However, it is to be noted that, when N side MOS transistor 18 is turned off, the voltage across MOS transistor 18 varies by the charging at the output capacitance of N side MOS transistor 18 and the junction capacitance of diode 19. In the case of the SiC device employed in the first embodiment, charging is time-consuming since the capacitance component is great. Therefore, it is considered that the change in the voltage across MOS transistor 18 is so slow that a great surge current is not generated.

Power semiconductor module 1 of the first embodiment can also suppress outwardly generation of EMI. This is because the amount of leakage magnetic flux at a remote site becomes lower than that of a conventional case, as compared to the difference in the current path, since the flow by displacement currents 47 and 48 are clockwise and counterclockwise, i.e. in opposite directions.

In power semiconductor module 1 of the first embodiment, SiC is employed as the semiconductor material of MOS transistors 16 and 18. A semiconductor of a wide bandgap typical of SiC can maintain the breakdown voltage even if the impurity concentration is increased to reduce the ON resistance. However, since increase of the impurity concentration will cause a greater output capacitance of the MOS transistor, the aforementioned displacement currents 47 and 48 generated at the time of switching will become greater. Therefore, in the case where a semiconductor of a wide bandgap is employed, a power semiconductor module 1 of the above-described configuration that can reduce the wiring inductance is particularly advantageous.

A specific configuration of P side power supply terminal 26, N side power supply terminal 27, and load side output terminal 28 will be described hereinafter.

Figure 3:
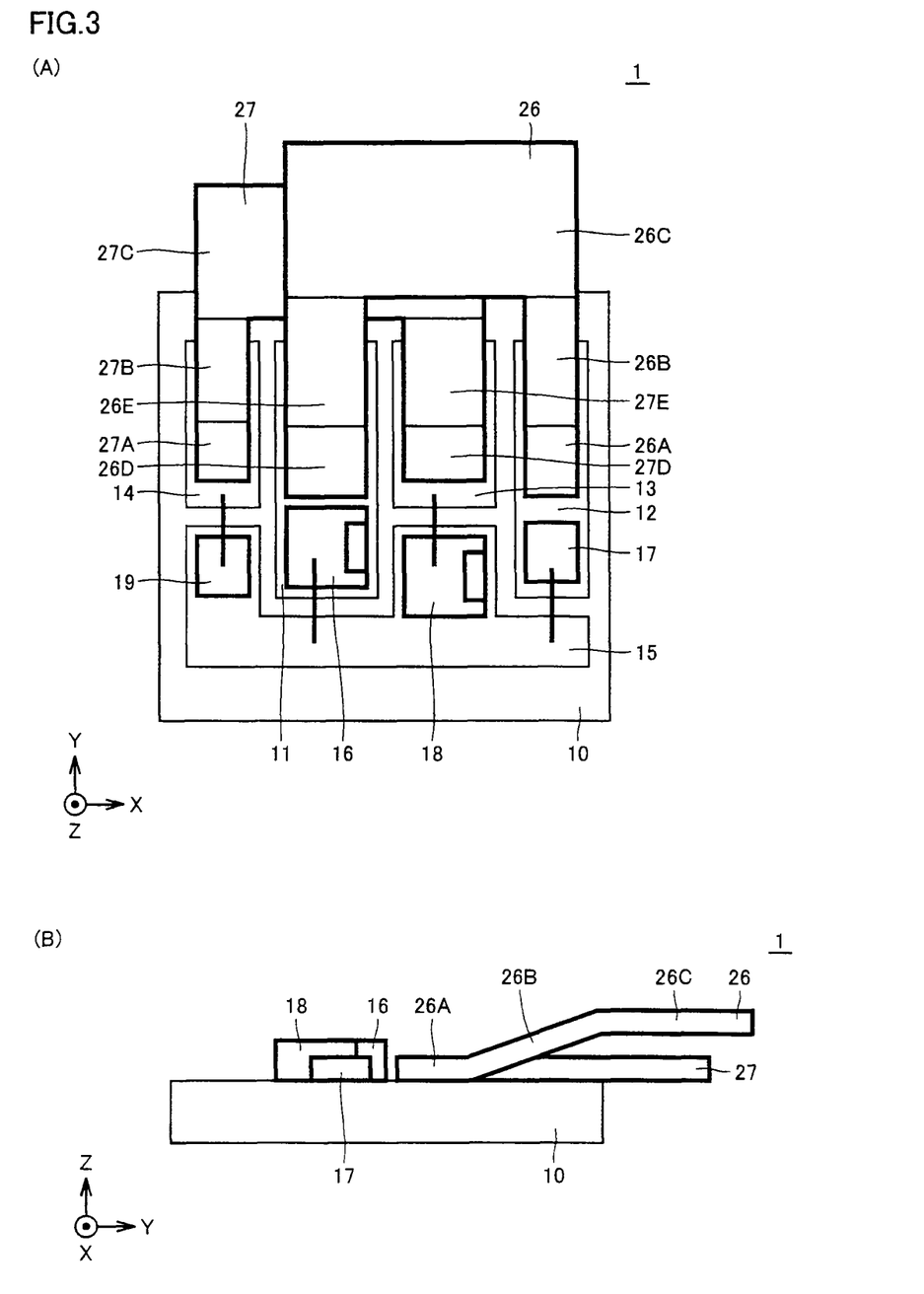
FIG. 3 is a diagram to describe the arrangement of power supply terminals 26 and 27 (initially at the time of fabrication) in power semiconductor module 1 of FIG. 1.
Figure 4:
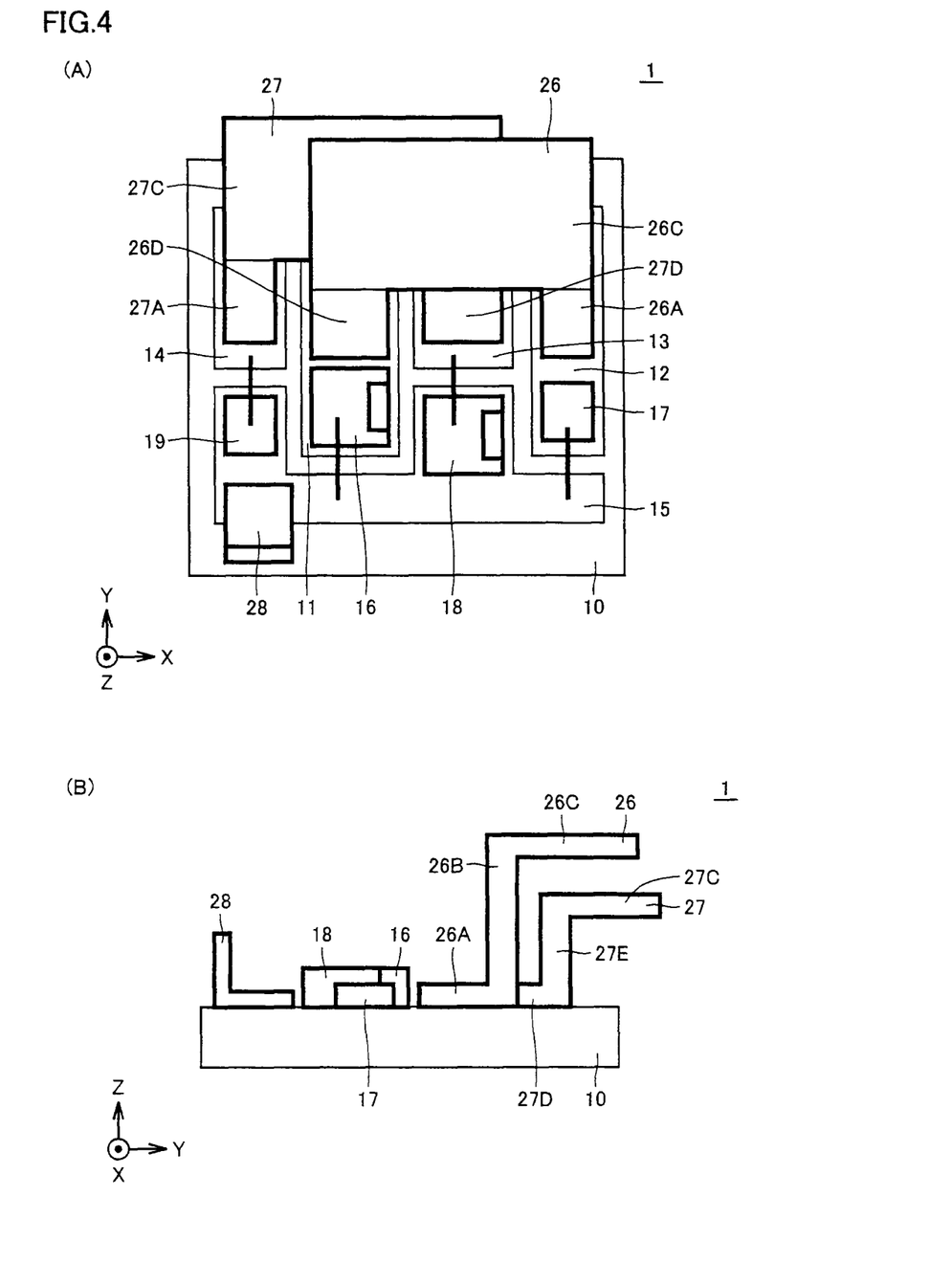
FIG. 4 is a diagram to describe the arrangement of power supply terminals 26 and 27 (completed after fabrication) in power semiconductor module 1 of FIG. 1.

FIGS. 3 and 4 are diagrams to describe the arrangement of power supply terminals 26 and 27 in power semiconductor module 1 of FIG. 1. FIG. 3 represents the configuration of power supply terminals 26 and 27 in power semiconductor module 1, initially at the time of fabrication. FIG. 4 represents the configuration of power supply terminals 26 and 27 in power semiconductor module 1, completed after fabrication. FIG. 4 also shows the arrangement of load side output terminal 28. In FIGS. 3 and 4, (A) and (B) are a plan view and a right side view, respectively.

Referring to FIGS. 3 and 4, each of P side power supply terminal 26 and N side power supply terminal 27 is formed of a metal plate having a thickness of 0.3 mm. P side power supply terminal 26 includes junction portions 26D and 26A coupled to conductor patterns 11 and 12, respectively, bending portions 26E and 26B continuous to junction portions 26D and 26A, respectively, and a base portion 26C connecting both bending portions 26B and 26E. Similarly, N side power supply terminal 27 includes junction portions 27D and 27A coupled to conductor patterns 13 and 14, respectively, bending portions 27E and 27B continuous to junction portions 27D and 27A, respectively, and a base portion 27C connecting both bending portions 27B and 27E.

The boundary between a bending portion and a junction portion and the boundary between a bending portion and the base portion are eventually bent substantially at right angles, as shown in FIG. 4. At the start of fabricating power semiconductor module 1, the boundaries of bending portions 26B, 26E, 27B and 27E are hardly bent, as shown in FIG. 3. Power supply terminals 26 and 27 are attached to insulation substrate 10 in this state.

Specific steps in fabrication will be described hereinafter. Junction portion 26A is solder-connected in proximity to the attachment site of diode 17 above conductor pattern 12. Junction portion 26D is solder-connected in proximity to the attachment site of MOS transistor 16 above conductor pattern 11. Junction portion 27A is solder-connected on conductor pattern 14 with just a gap required for wire bonding at the conductor pattern 15 side. Junction portion 27D is solder-connected on conductor pattern 13 with just a gap required for wire bonding at the conductor pattern 15 side. Further, load side output terminal 28 is fixed by solder on insulation substrate 10, partially overlapping conductor pattern 15, at a site opposite to the attachment site of diode 19 in the Y direction.

Following the solder-connection of terminals 26 to 28, a die-bonding step of fastening MOS transistors 16 and 18 and diodes 17 and 19 by soldering to corresponding conductor patterns is performed. Then, each electrode of MOS transistors 16 and 18 and diodes 17 and 19 is connected with a corresponding conductor pattern by a bonding wire.

Following wire bonding, bending portions 26B, 26E, 27B and 27E are bent in a direction coming closer to corresponding semiconductor elements 16 to 19, respectively, from a distant direction, as shown in FIG. 4. In other words, each of power supply terminals 26 and 27 is bent substantially at right angles at the boundary between the bending portion and the junction portion. Furthermore, each of power supply terminals 26 and 27 is bent substantially at right angles at the boundary between the bending portion and the base portion such that base portions 26C and 27C are substantially parallel to insulation substrate 10. Thus, power supply terminals 26 and 27 take the eventual shape. By employing the step set forth above, a wire bonding step in proximity to power supply terminals 26 and 27, that was difficult through conventional steps, is allowed. In the wire bonding step, space corresponding to the header of the wire bonder is required at the neighborhood of the bonding site. In other words, clearance of at least 10 mm is required between power supply terminals 26 and 27 and the spot of wire bonding. Accordingly, the conventional arrangement of power supply terminal was restricted. In the first embodiment, bending portions 26B, 26E, 27B and 27E of power supply terminals 26 and 27 are located away from the spot where wire bonding is to be performed in the bonding process, and are allowed to have the bending angle modified so as to be in proximity to the spot where wire bonding is to be carried out, after the bonding process. Accordingly, a wire bonding step in proximity to power supply terminals 26 and 27 is allowed.

As a result, each of power supply terminals 26 and 27 can be arranged in close proximity to semiconductor elements 16-19. Therefore, the inductance can be lowered, and the footprint of power semiconductor module 1 can be reduced. Moreover, conductor patterns 11-15 through which the main current flows can be formed short, allowing reduction in the electrostatic capacitance between conductor patterns 11-15 and the copper plate provided at the rear face of conductor patterns 11-15 for heat dispersion. By virtue of the reduction in the electrostatic capacitance, the current flowing from the main circuit to the aforementioned copper plate by electrostatic coupling can be reduced when a surge current flows at the time of switching. As a result, outwardly generation of EMI can be suppressed.

Figure 5:
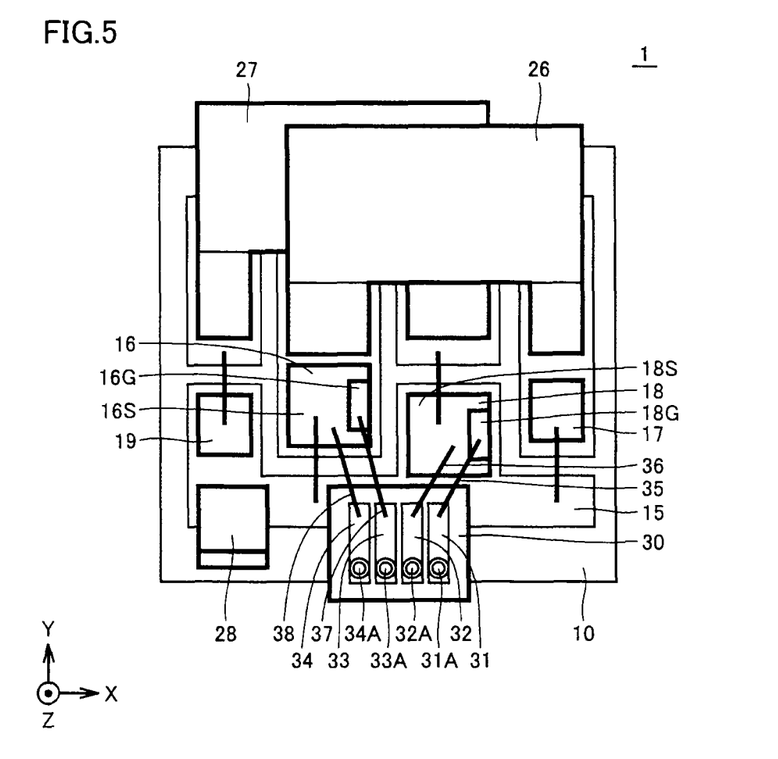
FIG. 5 is a diagram to describe the arrangement of gate terminals in power semiconductor module 1 of FIG. 1.

FIG. 5 is a diagram to describe the arrangement of gate terminals in power semiconductor module 1 of FIG. 1. Conventionally, a gate terminal is provided on the same insulation substrate where a semiconductor element is arranged. However, there is a problem that the power semiconductor module will become larger since the area of the insulation substrate is increased corresponding to the provision of a gate terminal on the insulation substrate.

Thus, power semiconductor module 1 of the first embodiment includes an insulation substrate 30 differing from insulation substrate 10 where semiconductor elements 16-19 are provided, as shown in FIG. 5. Power semiconductor module 1 includes insulation substrate 30, conductor patterns 31-34 formed of copper foil on insulation substrate 30, and metal gate terminals 31A, 33A and source terminals 32A, 34A, each connected by solder on conductor patterns 31, 33, 32 and 34, respectively.

In order to reduce the area of installation, insulation substrate 30 is fixed at a position in proximity to MOS transistors 16 and 18 on insulation substrate 10 so as to cover a portion of conductor pattern 15. Gate electrode 18G of MOS transistor 18 and conductor pattern 31 are connected by a bonding wire 35, whereas source electrode 18S and conductor pattern 32 are connected by a bonding wire 36. Gate electrode 16G of MOS transistor 16 and conductor pattern 33 are connected by a bonding wire 37, whereas source electrode 16S and conductor pattern 34 are connected by a bonding wire 38.

Since the area of insulation substrate 10 can be reduced by the configuration set forth above, the entire power semiconductor module 1 can be rendered compact. Further, since the length of the bonding wire from gate electrodes 16G and 18G is shortened, the wiring inductance of the gate wiring can be reduced. Since reduction in the inductance of the gate wiring leads to reduction in the overshooting voltage generated at the time of turning on MOS transistors 16 and 18, the damage on the gate insulation film of MOS transistors 16 and 18 can be reduced.

In the actual fabrication step, insulation substrate 30 is attached above insulation substrate 10, after conductor patterns 31 to 34 and terminals 31A to 34A are formed on insulation substrate 30. Then, wire bonding is effected between conductor patterns 31 to 34 and MOS transistors 16 and 18. Following wire bonding, sealing by an insulating material is performed.

According to power semiconductor module 1 of the first embodiment, a plurality of current paths between positive side power supply node 41A and load side conductor pattern 15 running through P side semiconductor elements 16 and 17 respectively, and current paths between negative side power supply node 41B and load side conductor pattern 15 running through N side semiconductor elements 18 and 19 respectively are aligned alternately along the periphery of conductor pattern 15. Therefore, surge currents 47 and 48 generated when MOS transistors 16 and 18 are switched will flow clockwise and counterclockwise, differing from each other in direction, to cancel the magnetic flux, whereby the effective inductance can be reduced. Thus, the surge voltage generated when MOS transistors 16 and 18 are switched can be reduced. As a result, it is not necessary to set an excessive breakdown voltage for MOS transistors 16 and 18 in consideration of the surge voltage. A compact and economic power semiconductor module 1 can be provided. Furthermore, outwardly generation of EMI can be suppressed.

In the first embodiment, another semiconductor material such as Si (silicon) may be employed instead of SiC for the material of MOS transistors 16 and 18. An advantage similar to that of SiC can be achieved even in this case.

Further, an IGBT (Insulated Gate Bipolar Transistor) may be employed instead of MOS transistors 16 and 18 as a switching element. An advantage similar to that of MOS transistors can be achieved even in this case.

Further, an advantage similar to that of the first embodiment described above can be achieved by using a PIN diode instead of the Schottky barrier diode constituting diodes 17 and 19.

Moreover, a ribbon-type conductor may be employed instead of a bonding wire for the connection between semiconductor elements 16 to 19 and conductor patterns 13 to 15. Alternatively, a plate-like electrode may be attached by soldering.

For the material of insulation substrate 10, another ceramic material may be used instead of AlN.

Moreover, in the case where MOS transistors 16 and 18 take a vertical structure, a parasitic diode (body diode) that is inevitably formed at the MOS transistor may be employed instead of diodes 17 and 19.

Second Embodiment

Figure 6:
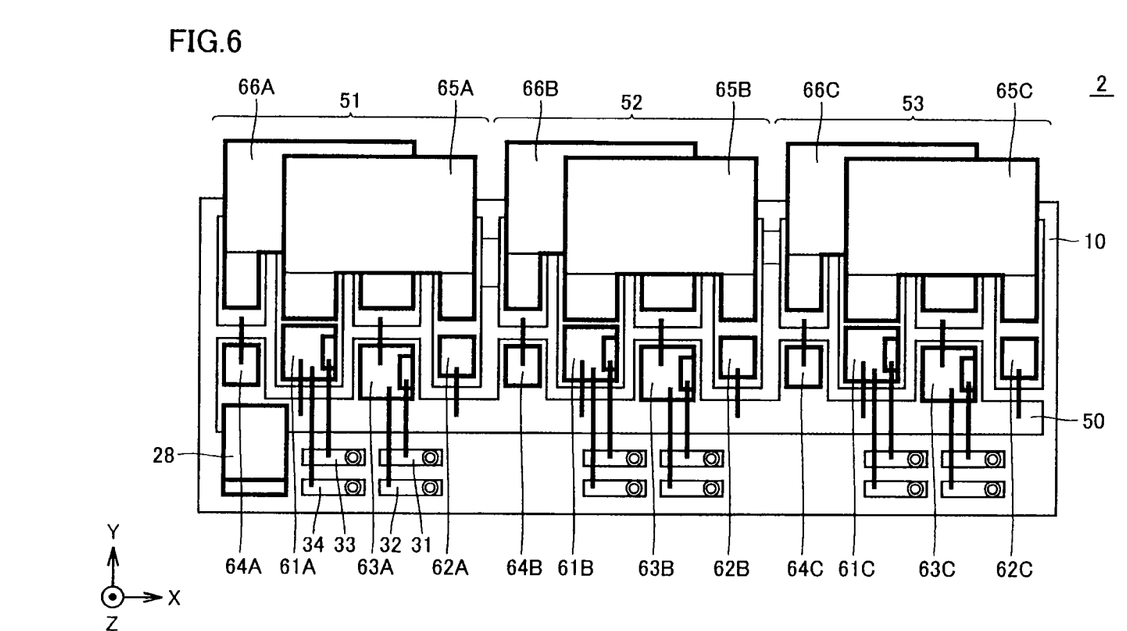
FIG. 6 is a plan view showing a configuration of the main part of a power semiconductor module 2 according to a second embodiment of the present invention.

FIG. 6 is a plan view showing a configuration of the main part of a power semiconductor module 2 according to a second embodiment of the present invention. In FIG. 6, the lateral direction, the vertical direction, and the direction perpendicular to the drawing sheet are taken as the X direction, the Y direction and the Z direction, respectively. The direction from the left side towards the right side in the drawing is the +X direction. The direction from the lower side towards the upper side in the drawing is the +Y direction. The direction from the back side to the top side of the drawing sheet is the +Z direction. An insulation substrate 10 shown in FIG. 6 is arranged along the XY plane. The thickness direction of insulation substrate 10 corresponds to the Z direction.

Figure 7:
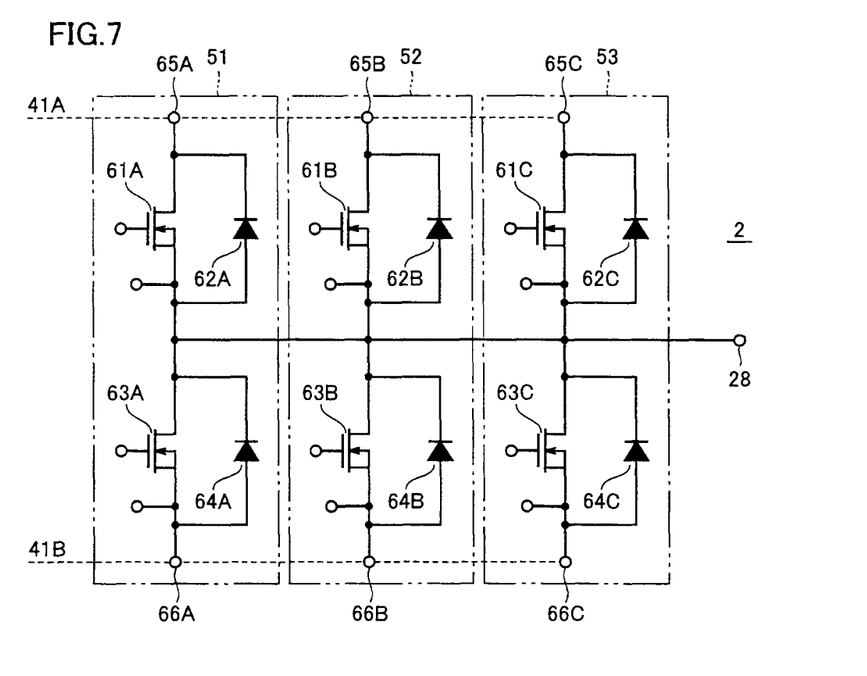
FIG. 7 is a circuit diagram corresponding to power semiconductor module 2 of FIG. 6.

FIG. 7 is a circuit diagram corresponding to power semiconductor module 2 of FIG. 6.

Referring to FIGS. 6 and 7, power semiconductor module 2 takes a configuration in which a plurality (three) of power semiconductor module 1 of FIGS. 1 and 2 are arranged in parallel. Each of upper and lower arms 51 to 53 in FIGS. 6 and 7 correspond to power semiconductor module 1 of FIGS. 1 and 2. Specifically, power semiconductor module 2 includes, as P side semiconductor elements, MOS transistors 61A, 61B and 61C and free wheeling diodes 62A, 62B and 62C, and as N side semiconductor elements, MOS transistors 63A, 63B, and 63C, and free wheeling diodes 64A, 64B and 64C. MOS transistor 61A and diode 62A are connected via a conductor pattern between P side power supply terminal 65A and load side output terminal 28. MOS transistor 61B and diode 62B are connected via a conductor pattern between P side power supply terminal 65B and load side output terminal 28. MOS transistor 61C and diode 62C are connected via a conductor pattern between P side power supply terminal 65C and load side output terminal 28. MOS transistor 63A and diode 64A are connected via a conductor pattern between N side power supply terminal 66A and load side output terminal 28. MOS transistor 63B and diode 64B are connected via a conductor pattern between N side power supply terminal 66B and load side output terminal 28. MOS transistor 63C and diode 64C are connected via a conductor pattern between N side power supply terminal 66C and load side output terminal 28. P side power supply terminals 65A, 65B and 65C are connected to a positive side power supply node 61A. N side power supply terminals 66A, 66B and 66C are connected to a negative side power supply node 41B. Load side output terminal 28 and a conductor pattern 50 connected to load side output terminal 28 are set in common between each of upper and lower arms 51 to 53. FIG. 6 shows conductor patterns 31-34 for gate terminals formed on insulation substrate 10.

Likewise with the first embodiment, the above-described configuration includes the current paths between positive side power supply node 41A and load side conductor pattern 50 running through P side semiconductor elements 61A, 61B, 61C, 62A, 62B and 62C respectively, and the current paths between negative side power supply node 41B and load side conductor pattern 50 running through N side semiconductor elements 63A, 63B, 63C, 64A, 64B and 64C respectively, aligned alternately along the periphery of conductor pattern 50. Therefore, the effective inductance can be reduced. As a result, the surge voltage generated at the time of switching MOS transistors 61A, 61B, 61C, 63A, 63B and 63C can be reduced. Further, diodes 64A and 62C are preferably arranged at the outermost side in the arrangement direction of the semiconductor elements, as shown in FIG. 6.

For the sake of simplification, each base portion of P side power supply terminals 65A, 65B and 65C in FIG. 6 may be formed integrally. Similarly, each base portion of N side power supply terminals 66A, 66B and 66C may be formed integrally. Accordingly, only one site is required for the connection between positive side power supply node 41A and the P side power supply terminal, and the connection between negative side power supply node 41B and the N side power supply terminal.

Third Embodiment

Figure 8:
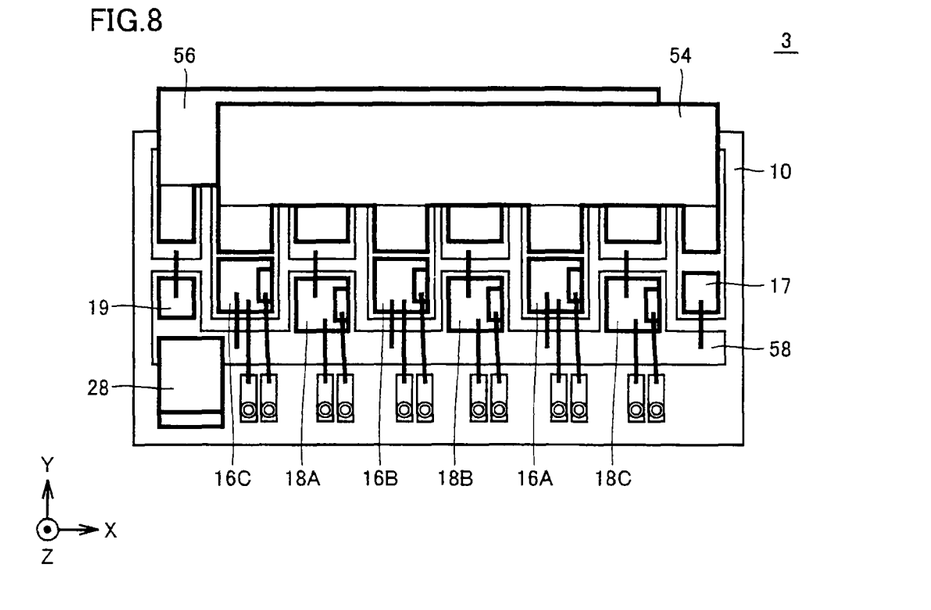
FIG. 8 is a plan view representing a configuration of the main part of a power semiconductor module 3 according to a third embodiment of the present invention.

FIG. 8 is a plan view showing a configuration of the main part of a power semiconductor module 3 according to a third embodiment of the present invention. In FIG. 8, the lateral direction, the vertical direction, and the direction perpendicular to the drawing sheet are taken as the X direction, the Y direction and the Z direction, respectively. The direction from the left side towards the right side in the drawing is the +X direction. The direction from the lower side towards the upper side in the drawing is the +Y direction. The direction from the back side to the top side of the drawing sheet is the +Z direction. An insulation substrate 10 shown in FIG. 8 is arranged along the XY plane. The thickness direction of insulation substrate 10 corresponds to the Z direction.

Figure 9:
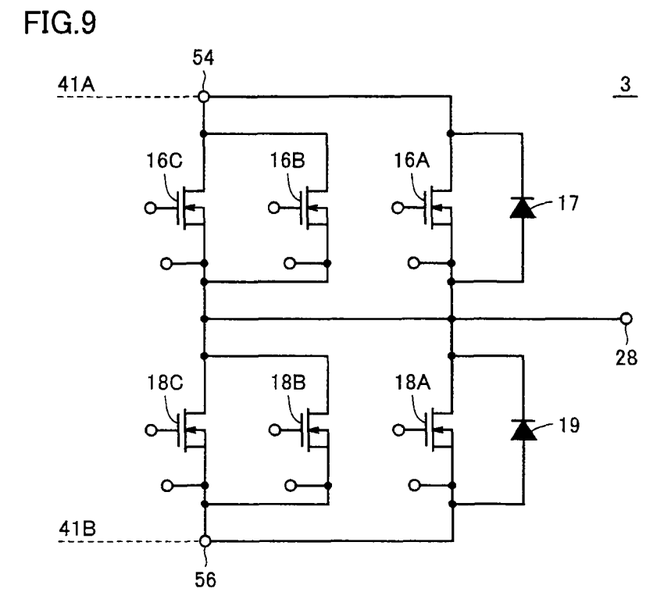
FIG. 9 is a circuit diagram corresponding to power semiconductor module 3 of FIG. 7.

FIG. 9 is a circuit diagram corresponding to power semiconductor module 3 of FIG. 7.

Referring to FIGS. 8 and 9, power semiconductor module 3 is configured having two MOS transistors added parallel to MOS transistors 16 and 18 of FIGS. 1 and 2, respectively. In other words, power semiconductor module 3 includes MOS transistors 16A, 16B and 16C and free wheeling diode 17 as P side semiconductor elements, and MOS transistors 18A, 18B and 18C and free wheeling diode 19 as N side semiconductor elements. MOS transistors 16A, 16B and 16C and diode 17 are connected via a conductor pattern between P side power supply terminal 54 and load side output terminal 28. Further, MOS transistors 18A, 18B and 18C and diode 19 are connected via a conductor pattern between N side power supply terminal 56 and load side output terminal 28. P side power supply terminal 54 is connected to positive side power supply node 41A. N side power supply terminal 56 is connected to negative side power supply node 41B. Further, a conductor pattern 58 connected to load side output terminal 28 is set in common.

Likewise with the first embodiment, the current paths between positive side power supply node 41A and load side conductor pattern 58 running through P side semiconductor elements 17, 16A, 16B and 16C respectively, and the current paths between negative side power supply node 41B and load side conductor pattern 58 running through N side semiconductor elements 19, 18A, 18B and 18C respectively are aligned alternately along the periphery of conductor pattern 58. Therefore, the effective inductance can be reduced. As a result, the surge voltage generated at the time of switching MOS transistors 16A, 16B, 16C, 18A, 18B and 18C can be reduced. Further, diodes 17 and 19 are preferably arranged at the outermost side in the arrangement direction of the semiconductor elements, as shown in FIG. 8.

It should be understood that the embodiments disclosed herein are illustrative and non-restrictive in every respect. The scope of the present invention is defined by the terms of the claims, rather than the description above, and is intended to include any modification within the scope and meaning equivalent to the terms of the claims.

DESCRIPTION OF THE REFERENCE CHARACTERS 1, 2, 3 power semiconductor module; 10 insulation substrate; 11-15 conductor pattern; 16, 18, 16A-16C, 18A-18C MOS transistor (switching element); 17, 19 diode; 26 P side power supply terminal; 26A, 26D junction portion; 26B, 26E bending portion; 26C base portion; 27 N side power supply terminal; 27A, 27D junction portion; 27B, 27E bending portion; 27C base portion; 28 load side output terminal; 30 insulation substrate; 31A, 33A gate terminal; 32A, 34A source terminal; 31-34 conductor pattern; 41 DC power supply; 41A positive side power supply node; 41B negative side power supply node; 47, 48 surge current (displacement current); 50 conductor pattern; 54 P side power supply terminal; 56 N side power supply terminal; 58 conductor pattern; 61A-61C, 63A-63C MOS transistor; 62A-62C, 64A-64D diode; 65A-65C P side power supply terminal; 66A-66C N side power supply terminal.

The invention claimed is:

1. A power semiconductor module comprising:
a first insulation substrate;
a load side conductor pattern formed on a surface of said first insulation substrate;
a plurality of first semiconductor elements provided on said first insulation substrate, electrically connected in parallel to each other between a positive side power supply and said load side conductor pattern, wherein at least one of said plurality of first semiconductor elements is a switching element;
a plurality of second semiconductor elements provided on said first insulation substrate, electrically connected in parallel to each other between a negative side power supply and said load side conductor pattern, wherein at least one of said plurality of second semiconductor elements is being a switching element;
a plurality of first conductor patterns formed on the surface of said first insulation substrate, said plurality of first conductor patterns corresponding to said plurality of first semiconductor elements, respectively, and constituting a plurality of first current paths, respectively, each said first current path running from said positive side power supply to said load side conductor pattern through a corresponding first conductor pattern and a corresponding first semiconductor element in turn; and
a plurality of second conductor patterns formed on the surface of said first insulation substrate, said plurality of second conductor patterns corresponding to said plurality of second semiconductor elements, respectively, and constituting a plurality of second current paths, respectively, each said second current path running from said load side conductor pattern to said negative side power supply through a corresponding second semiconductor element and a corresponding second conductor pattern in turn, wherein
said plurality of first current paths are aligned alternately along a periphery of said load side conductor pattern on the surface of said first insulation substrate.

2. The power semiconductor module according to claim 1, wherein
at least one of said plurality of first semiconductor elements is a diode having a cathode connected to said positive side power supply via a corresponding first conductor pattern, and an anode connected to said load side conductor pattern, and
at least one of said plurality of second semiconductor elements is a diode having a cathode connected to said load side conductor pattern, and an anode connected to said negative side power supply via a corresponding second conductor pattern.

3. The power semiconductor module according to claim 2, wherein a current path at each end among said plurality of first and second current paths is a current path running through a diode among said plurality of first semiconductor elements, or a current path running through a diode among said plurality of second semiconductor elements.

4. The power semiconductor module according to claim 1, wherein said plurality of first semiconductor elements and said plurality of second semiconductor elements are arranged alternately substantially linearly on said first insulation substrate.

5. The power semiconductor module according to claim 1, further comprising:
   one or more positive side power supply terminals for applying voltage from said positive side power supply to a corresponding one or more of said plurality of first semiconductor elements; and
   one or more negative side power supply terminals for applying voltage from said negative side power supply to a corresponding one or more of said plurality of second semiconductor elements, wherein
   each of said one or more positive side power supply terminals and negative side power supply terminals includes
      one or more plate-like junction portions provided in proximity to a corresponding one or more semiconductor elements, respectively, and connected to said first insulation substrate via one or more of said first or second conductor patterns; and
      one or more plate-like bending portions continuous to said one or more junction portions, respectively, and bent in a direction coming closer to the corresponding one or more semiconductor elements from a distant direction.

6. The power semiconductor module according to claim 5, further comprising:
   a second insulation substrate fixedly attached to a region partially covering said load side conductor pattern on said first insulation substrate; and
   a plurality of control terminals on said second insulation substrate, for electrically connecting to control electrodes of a plurality of switching elements, respectively, included in said plurality of first and second semiconductor elements.

7. The power semiconductor module according to claim 1, wherein the switching element included in said plurality of first and second semiconductor elements is formed using a semiconductor material having a bandgap greater than the bandgap of silicon.

8. The power semiconductor module according to claim 1, further comprising:
   one or more positive side power supply terminals connected to said plurality of first conductor patterns for electrical connection with said positive power supply;
   one or more negative side power supply terminals connected to said plurality of second conductor patterns for electrical connection with said negative side power supply; and
   a load side output terminal connected to said load side conductor pattern, wherein
   said plurality of first semiconductor elements and said plurality of second semiconductor elements are arranged alternately along a virtual straight line on a surface of said first insulation substrate,
   said one or more positive side power supply terminals are provided on a side identical to said first or more negative side power supply terminals relative to said virtual straight line, in plan view of said first insulation substrate, and
   said load side output terminal is provided at a side opposite to said one or more positive side power supply terminals relative to said virtual straight line, in plan view of said first insulation substrate.

* * * * *